United States Patent
Perel et al.

(10) Patent No.: US 8,937,003 B2
(45) Date of Patent: Jan. 20, 2015

(54) TECHNIQUE FOR ION IMPLANTING A TARGET

(75) Inventors: Alexander S. Perel, Danvers, MA (US); Craig R. Chaney, Lanesville, MA (US); Wayne D. LeBlanc, Danvers, MA (US); Robert Lindberg, Rockport, MA (US); Antonella Cucchetti, Manchester by the Sea, MA (US); Neil J. Bassom, Hamilton, MA (US); David Sporleder, Billerica, MA (US); James Young, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 85 days.

(21) Appl. No.: 13/613,964

(22) Filed: Sep. 13, 2012

(65) Prior Publication Data
US 2013/0072008 A1    Mar. 21, 2013

Related U.S. Application Data

(60) Provisional application No. 61/535,640, filed on Sep. 16, 2011.

(51) Int. Cl.
| H01L 21/26 | (2006.01) |
| H01J 27/00 | (2006.01) |
| C23C 14/48 | (2006.01) |
| C23C 14/56 | (2006.01) |
| H01J 37/08 | (2006.01) |
| H01J 37/317 | (2006.01) |

(52) U.S. Cl.
CPC ............. *C23C 14/48* (2013.01); *C23C 14/564* (2013.01); *H01J 37/08* (2013.01); *H01J 37/3171* (2013.01); *H01J 2237/022* (2013.01)
USPC ........ 438/513; 438/514; 250/423 R; 250/426; 250/492.2; 315/111.21; 315/111.81

(58) Field of Classification Search
USPC ........... 438/513, 514; 250/23 R, 426, 492.21, 250/492.2; 315/111.01, 111.21, 111.81
See application file for complete search history.

(56) References Cited

U.S. PATENT DOCUMENTS

| 7,586,109 | B2 | 9/2009 | Perel et al. | |
| 2008/0179545 | A1* | 7/2008 | Perel et al. | ............... 250/492.21 |
| 2008/0237496 | A1 | 10/2008 | Gupta | |
| 2011/0021011 | A1 | 1/2011 | Sweeney et al. | |
| 2012/0048723 | A1* | 3/2012 | Chaney | .................... 204/192.11 |

FOREIGN PATENT DOCUMENTS

WO    2009102754 A2    8/2009

* cited by examiner

*Primary Examiner* — Hsien Ming Lee

(57) ABSTRACT

A technique for ion implanting a target is disclosed. In accordance with one exemplary embodiment, the technique may be realized as a method for ion implanting a target, the method comprising: providing a predetermined amount of processing gas in an arc chamber of an ion source, the processing gas containing implant species and implant species carrier, where the implant species carrier may be one of O and H; providing a predetermined amount of dilutant into the arc chamber, wherein the dilutant may comprise a noble species containing material; and ionizing the processing gas and the dilutant.

19 Claims, 6 Drawing Sheets

TECHNIQUE FOR ION IMPLANTING A TARGET

PRIORITY

This Application is a Non-Provisional Application of and claims priority to U.S. Provisional Application Ser. No. 61/535,640, filed on Sep. 16, 201, and entitled "Technique For Improving The Performance And Extending The Lifetime Of An Ion Source With Gas Dilution." The U.S. Provisional Application Ser. No. 61/535,640 is incorporated herein by reference in its entirety.

FIELD

The present disclosure relates generally to semiconductor device manufacturing and, more particularly, to a technique for improving the performance and extending the lifetime of an ion source.

BACKGROUND

Ion implantation is a process used in a device manufacturing in which one or more desired species, in a form of ions, are implanted into a target to alter at least one of electrical, optical, chemical, and mechanical property of the target. Depending on the device, the target may be a substrate such as a wafer or a film or other material formed thereon. In integrated circuit (IC) manufacturing, the target may be a silicon wafer. In light emitting diode (LED) manufacturing, the target may be a compound semiconductor substrate. As proper device performance often requires a precise electrical, chemical, or mechanical property, precise ion implantation process is often desired.

The ion implantation system may include an ion source to generate ions of desired species. The ion implantation system may also include a complex series of beam-line components through which the ions generated in the ion source pass. The beam-line components may include, for example, an extraction system, a filter magnet, an acceleration or deceleration column, an analyzer magnet, a rotating mass slit, a scanner, and a corrector magnet. Much like a series of optical lenses that manipulate a light beam, these beam-line components receive the ions, filter, focus, or otherwise manipulate the ions into an ion beam having desired shape, energy, species, angle, and other characteristics. The ion implantation system may also include a number of measurement devices, such as a dose control Faraday cup, a traveling Faraday cup, and a setup Faraday cup to monitor and control the ion beam characteristics.

The substrate located downstream of the beam-line components, may be positioned in the path of the ion beam and exposed to the ion beam. In some ion implantation systems, the positioning of the substrate in the path of the ion beam may be achieved with a substrate scanner (not shown) capable of translating, rotating, and tilting the substrate.

To generate the ions or ion beam of desired species, processing gas with the species is introduced into the ion source and ionized. Generally, the ion source includes indirectly heated cathode (IHC). When powered by a filament disposed near, the cathode in the IHC may emit electrons that ionize the processing gas into ions. The ions of desired species are then extracted from the ion source and directed toward the target via the beam-line components.

The conventional IHC, although adequate, has short lifetime. One cause of the early failure may be due to excessive accumulation of byproducts on the inner surfaces of the ion source. In particular, the processing gas or the ions of the processing gas in the ion source may condense to form the byproduct, and such byproduct may accumulate on the inner wall of the ion source, and the aperture through which the ions are extracted from the ion source (i.e. the extraction aperture). If excessively accumulated on the cathode of IHC, the byproduct may reduce the rate by which the cathode emits the electrons for the ionization. As a result, less than optimum rate of ionization may occur. If excessively accumulated on the extraction aperture, non-uniform ions or ions with undesirable shape may be extracted from the ion source. Consequently, the ion source with excessive material deposited is highly undesirable.

To remove the byproduct, the ion source may have to be periodically cleaned or replaced with another ion source without the byproduct. The process by which the ion source is replaced or cleaned, however, may require powering down the entire ion implantation system, during which the ion implantation system cannot be utilized. Additional time to power up and tune the ion implanter is also needed before the ion implantation system can be used. As a result, performance degradation and short lifetime of the ion source greatly reduces the productivity of the ion implantation system.

In view of the foregoing, it would be desirable to provide a technique for improving the performance and extending the lifetime of an ion source to overcome the above-described inadequacies and shortcomings.

SUMMARY

A technique for ion implanting a target is disclosed. In accordance with one exemplary embodiment, the technique may be realized as a method for ion implanting a target, the method comprising: providing a predetermined amount of processing gas in an arc chamber of an ion source, the processing gas containing implant species and implant species carrier, where the implant species carrier may be one of O and H; providing a predetermined amount of dilutant into the arc chamber, wherein the dilutant may comprise a noble species containing material; and ionizing the processing gas and the dilutant.

In accordance with other aspects of this particular exemplary embodiment, the noble species may comprise one of Ar, Kr, and Xe.

In accordance with further aspects of this particular exemplary embodiment, the implant species may be C.

In accordance with additional aspects of this particular exemplary embodiment, the processing gas may comprise one of CO and $CO_2$.

In accordance with further aspects of this particular exemplary embodiment, the dilutant may further comprise H.

In accordance with other aspects of this particular exemplary embodiment, the dilutant may be a mixture of Ar and $H_2$.

In accordance with further aspects of this particular exemplary embodiment, the dilutant may be a mixture of Kr and $H_2$.

In accordance with additional aspects of this particular exemplary embodiment, the dilutant may be a mixture of Xe and $H_2$.

In accordance with other aspects of this particular exemplary embodiment, the processing gas may be $CH_4$.

In accordance with additional aspects of this particular exemplary embodiment, the method may further comprise providing a film on an inner wall of the arc chamber housing wall and a repeller of the ion source, where the film may contain the implant species.

In accordance with further aspects of this particular exemplary embodiment, the method may further comprise: extracting the ions of the implant species from the ion source and directing the ions of the implant species toward the target.

In accordance with another exemplary embodiment, the technique may be realized as a method for ion implanting a target, the method comprising: providing a predetermined amount of processing gas in an arc chamber of the ion source, the processing gas containing implant species and implant species carrier, where the implant species carrier may be one of O and H; providing a predetermined amount of dilutant into the arc chamber, where the dilutant may comprise a noble species containing material, and where the noble species may comprise one of Ar, Kr, and Xe; ionizing the processing gas and the dilutant to generate ions of the implant species; extracting the ions of the implant species from the ion source; and directing the ions of the implant species toward the target.

In accordance with other aspects of this particular exemplary embodiment, the processing gas may comprise one of CO, and $CO_2$, where the implant species may be C.

In accordance with further aspects of this particular exemplary embodiment, the processing gas may comprise $CH_4$, where the implant species may be C.

In accordance with additional aspects of this particular exemplary embodiment, the dilutant may further comprise $H_2$.

In accordance with further aspects of this particular exemplary embodiment, the dilutant may be a mixture of Ar and $H_2$.

In accordance with additional aspects of this particular exemplary embodiment, the dilutant may be a mixture of Kr and $H_2$.

In accordance with further aspects of this particular exemplary embodiment, the dilutant may be a mixture of Xe and $H_2$.

In accordance with another exemplary embodiment, the technique may be realized as a method for ion implanting a target, the method comprising: ionizing a predetermined amount of processing gas and dilutant in an arc chamber of the ions source to generate ions of implant species, where the processing gas may be C and O containing material, where C may be the implant species, and where the dilutant may comprise a material containing one of Ar, Kr, and Xe; and extracting ions of C from the arc ion source and directing the ions of the implant species toward the target In accordance with other aspects of this particular exemplary embodiment, the dilutant may further comprise H containing material.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

Figure 1:
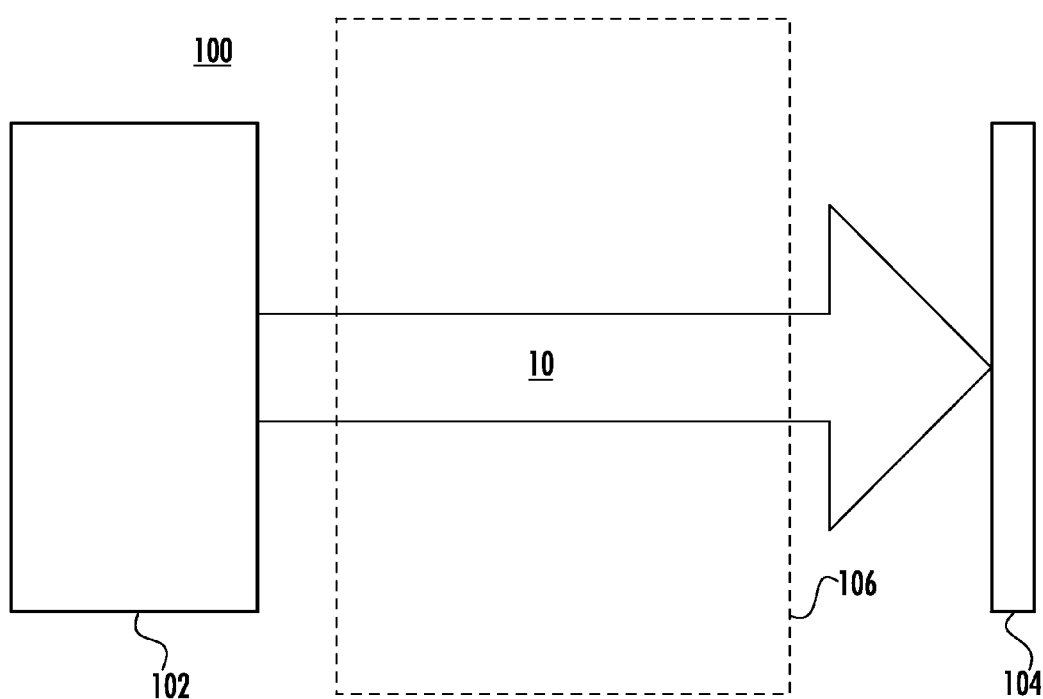
FIG. 1 illustrates an ion implantation system according to one embodiment of the present disclosure.

Referring to FIG. 1, there is shown an exemplary ion implantation system 100 according to one embodiment of the present disclosure. The ion implantation system 100 according to the present embodiment may include an ion source 102 that is configured to generate ions 10. For clarity and simplicity, the ion source 102 in the present disclosure embodiment is described in relation to an inductively heated cathode (IHC) ion source. However, other ion sources including Freeman source and RF ion source are not precluded in the present disclosure.

Downstream of the ion source 102, a target 104 may be disposed. As noted above, the target 104 may be a substrate, a film or a structure on a substrate, etc. . . . . Between the ion source 102 and the target 104, the ion implantation system 100 may optionally include a series of beam-line components 104. If included, the beam-line components may include at least one of the extraction system, mass slit, a scanner, the mass analyzer, one or more acceleration or deceleration lenses, collimating magnet, beam scanner, and other components capable of manipulating the ions into an ion beam having desired size, shape, energy, species, angle, and other characteristics.

In operation, the ions of desired implant species are generated within the ion source 102. To generate the ions, a processing material containing a desired implant species is introduced into the ion source, where the material is ionized and a plasma containing the ions is generated. Preferably, a processing material in gaseous or vapor form is used. However, the present disclosure does not preclude introducing the processing material in a solid form into the ion source 102.

Generally, the processing material may contain one or more different species. However, the present disclosure does not preclude the processing material comprising only one species. If two or more species are included in the processing material, at least one species may be the implant species. Meanwhile, one other species in the processing material may be implant species carrier. The implant species carrier may be the species that is preferably not implanted into the target 104. However, those of ordinary skill in the art will recognize that in some embodiments, the processing material may contain two or more species, and all species are implanted into the target 104.

In the present disclosure, the desired implant species in the processing material may include species found in Group 13 to Group 17 of the periodic table such as, for example, boron (B), aluminum (Al), gallium (Ga), indium (In), thallium (Tl), carbon (C), silicon (Si), germanium (Ge), tin (Sn), lead (Pb), phosphorous (P), arsenic (As), antimony (Sb), bismuth (Bi), oxygen (O), sulfur (S), selenium (Se), tellurium (Te), bromium (Br), and iodine (I). Those of ordinary skill in the art will recognize that the above examples are not exhaustive, and other species, including other species in other groups, may also be used. Meanwhile, the implant species carrier in the processing material may be species found in Group 1, and Group 15 to Group 17 of the periodic table. Several examples of the implant species carrier in the processing material may include hydrogen (H), nitrogen (N), oxygen (O), fluorine (F), and chlorine (Cl). Much like the examples noted above, the examples of the implant species carrier provided above are not exhaustive, and other species, including other species in other groups, may also be used. Specific examples of the processing materials may include boron trifluoride ($BF_3$), borane ($BH_3$), diborane ($B_2H_6$), carbon monoxide (CO), carbon dioxide ($CO_2$), methane ($CH_4$), phosphorus trifluoride ($PF_3$), phosphine ($PH_3$), arsenic trifluoride ($AsF_3$), and arsine (AsH3). Although various processing materials may be included in the present disclosure, the present disclosure will focus on, for clarity and simplicity, CO, $CO_2$, and $CH_4$ as the processing material, where the implant species is C and the implant species carrier is O and/or H. Those of ordinary skill in the art should recognize that other processing materials containing other implant species and/or implant species carriers are not excluded. Moreover, those of ordinary skill in the art will recognize that in some cases, the species described above as the implant species carrier may, in fact, be used as the implant species, or vice versa.

In some cases, one or more non-implant materials are also introduced into the ion source 102. The non-implant materials may include dilutant that, if added, may enhance ionization and promote formation of the plasma containing the ions of the implant species. As discussed below, the non-implant materials may also enhance the lifetime and improve the performance of the ion source 102. In the present disclosure, the non-implant species may include species found in Group 1, and Group 15-18 of the periodic table. Several specific examples of the non-implant materials may include materials containing hydrogen (H); inert species such as nitrogen (N); halogen species such as fluorine (F), chlorine (Cl), bromine (Br), and iodine (I); and noble species such as helium (He), neon (Ne), argon (Ar), krypton (Kr), and xenon (Ne). Those of ordinary skill in the art will recognize that the above examples of the non-implant material or dilutant are not exhaustive, and material containing other species may also be used as the non-implant materials. For clarity and simplicity, the present disclosure will focus on non-implant materials or dilutants containing $H_2$ and Xe.

In the ion source 102, a plasma containing, among others, the ions of desired implant species and the ions and other chemical fragments of the processing and non-implant materials are generated. The ions 10 of desired implant species are extracted from the ion source 102. The ions 10 may be directed toward and implanted into the target 104. If included, the beam-line components 106 may manipulate the ions 10 into a beam having desired energy, species, angle, and other properties before the ion beam 10 reaches the target 104. The ions of species other than the implant species and other chemical fragments, meanwhile, may be extracted or evacuated from the ion source and discarded.

Figure 2A:
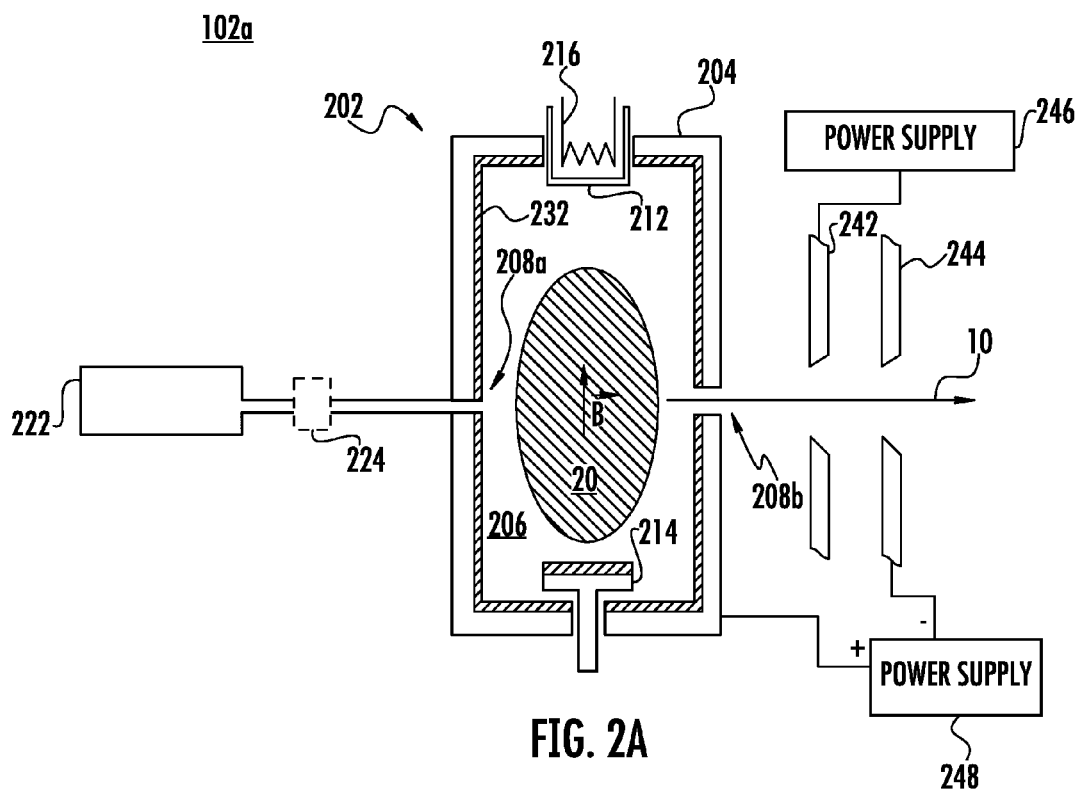
FIG. 2A illustrates an exemplary ion source according to one embodiment of the present disclosure.

Referring to FIG. 2A, there is shown an exemplary ion source 102a according to one embodiment of the present disclosure. The ion source 102a shown in the figure may be incorporated into the ion implantation system 100 shown in FIG. 1. As such, the components in FIG. 2A should be understood in relation to the ion implantation system 100 shown in FIG. 1.

The ion source 102a of the present embodiment may include an arc chamber housing 202 comprising one or more arc chamber housing walls 204. As illustrated in FIG. 2A, the arc chamber housing walls 204 may define an arc chamber 206. The arc chamber housing 202 may optionally include one or more ports 208a through which one or more materials may be introduced into the arc chamber 206. The arc chamber housing 202 may also include an extraction aperture 208b, through which the ions 10 may be emitted.

The ion source 102a may also include a cathode 212 and a repeller 214 positioned on opposite sides of the arc chamber housing 202. In the present embodiment, the repeller 214 may be electrically isolated. Near the cathode 212, a filament 216 may be disposed. The filament 216, when powered, may emit electrons that bombard the cathode 208. The cathode 208 is then heated to the thermionic emission temperatures, and emits electrons toward the arc chamber 206. One or more source magnets (not shown) may be disposed near the arc chamber housing 202 to produce a magnetic field B within the arc chamber 206.

As illustrated in FIG. 2A, an extraction system is disposed near the extraction aperture 208b of the arc chamber housing 202. In the present embodiment, the extraction system may comprise a suppression electrode 242 and a ground electrode 244. Each of the suppression electrode 242 and the ground electrode 244 may have an aperture aligned with the extraction aperture 208b for extraction of the ions 10 from the arc chamber 206. An extraction power supply 248 may provide an extraction voltage to the ground electrode 244 for extraction of the ion beam 10 from the arc chamber 206. The extraction voltage may be adjusted according to the desired energy of the ion beam 10. A suppression power supply 246 may bias the suppression electrode 242 to inhibit movement of electrons within the ion beam 10.

In the present embodiment, the ion source 102 may further comprise a film 232 comprising one or more implant species. For implantation of Ga ions into the target 104, the film 232 may contain Ga species. For implantation of other ions, other films containing other species may be used. In the present embodiment, the description will focus on a film 232 containing C species for C ion implantation. As illustrated in the figure, the film 232 may be disposed near the repeller 214 and the inner wall of the arc chamber housing wall 204. Although not shown, the present disclosure does not preclude a scenario where the film 302 is also disposed on the cathode 208, another one of the arc chamber components. The film 232 may be deposited and fixed onto the arc chamber components, or may be provided as a removable liner near the arc chamber components. In some embodiments, the repeller 214, the inner wall of the arc chamber housing wall 204, and/or the cathode 208 may be made from the material containing the implant species.

A container 222 may be disposed near the arc chamber housing 202 to introduce one or more non-implant materials into the arc chamber 206 via the port 208a. In addition, an optional material controller 224 may be disposed to control the amount of the non-implant materials introduced into the arc chamber 206. In the present embodiment, the non-implant material contained in the container 222 may be a mixture of H$_2$ and Xe gases. However, in some embodiments, the container 222 may contain one of H$_2$ and Xe gas.

In operation, H$_2$ and Xe are introduced into the arc chamber 206 from the container 222. When the filament 216 is powered, the cathode 212 thermionically emits electrons that collide with H$_2$ and Xe to generate H and Xe ions. The H and Xe ions, meanwhile, may bombard the film 232, sputtering and releasing C from the film 232. As a result, plasma 20 containing, among others, H, Xe, and C ions may form. The ions 10 in the plasma 20 are then extracted from the arc chamber housing 202, and the C ions may be directed toward and implanted into the target 104. The other ions including H and Xe ions may be evacuated and discarded.

As noted above, the lifetime of the ion source 102a may be limited by excessive accumulation of the byproducts on the arc chamber components exposed to the plasma 20. Generally, one or more components in the arc chamber housing 202 are made with tungsten (W) or tungsten containing material. When C ions are generated in the arc chamber 206, C ions may react with W surface to form tungsten carbide (WC). Other species may also react and other types of the byproduct may result. Such byproduct, if formed on the cathode, may reduce the rate by which the cathode emits the electrons for the ionization. If formed near the extraction aperture, the byproducts may prevent extraction of uniform ions or ions with desirable shape. Further, the byproduct, which may be electrically insulating, may prevent proper grounding of the arc chamber housing wall 204. Without proper grounding, the plasma 20 may not ignite or there may be diminished arc current. Additional power to the filament 216 and higher cathode thermionic emission temperature may be needed to achieve the same amount of arc current. More power applied to the filament 216 and higher cathode thermionic emission temperature, at the same time, may lead to greater formation of the byproduct.

It has been found that adding H$_2$ and Xe to the arc chamber 206 generating C ions greatly extend the lifetime of the ion source 102a. It has been found that H ions may react with C ions to form, among others, CH$_4$. As such, H ions may reduce the amount of C ions that can react with W surface. Methane, in a vapor or gaseous form, may be evacuated from the arc chamber 206 readily, thus reducing the formation of the byproduct. Meanwhile, Xe ions may collide and breakup the existing byproduct. By reducing the amount of the byproducts formed within the arc chamber 206, the lifetime of the ion source 102a may be extended, and the efficiency of the entire ion implantation system 100 may be increased. In addition, Xe ions may enhance formation and operation of the plasma containing C ions. Such an enhancement may enable the ion source 102a to generate and emit higher ion current Referring to FIG. 2B-2D, there are shown several exemplary ion sources 102b-102d according to other embodiments of the present disclosure. Those of ordinary skill in the art will recognize many of the components included in the ion source 102a shown in FIG. 2A are also included in the ion sources 102b-102d shown in FIG. 2B-2D. As such, the components in FIG. 2B-2D should be understood in relation to the components in FIG. 2A. In addition, the ion sources 102b-102d should be understood in relation to the ion implantation system 100 shown in FIG. 1.

Figure 2B:
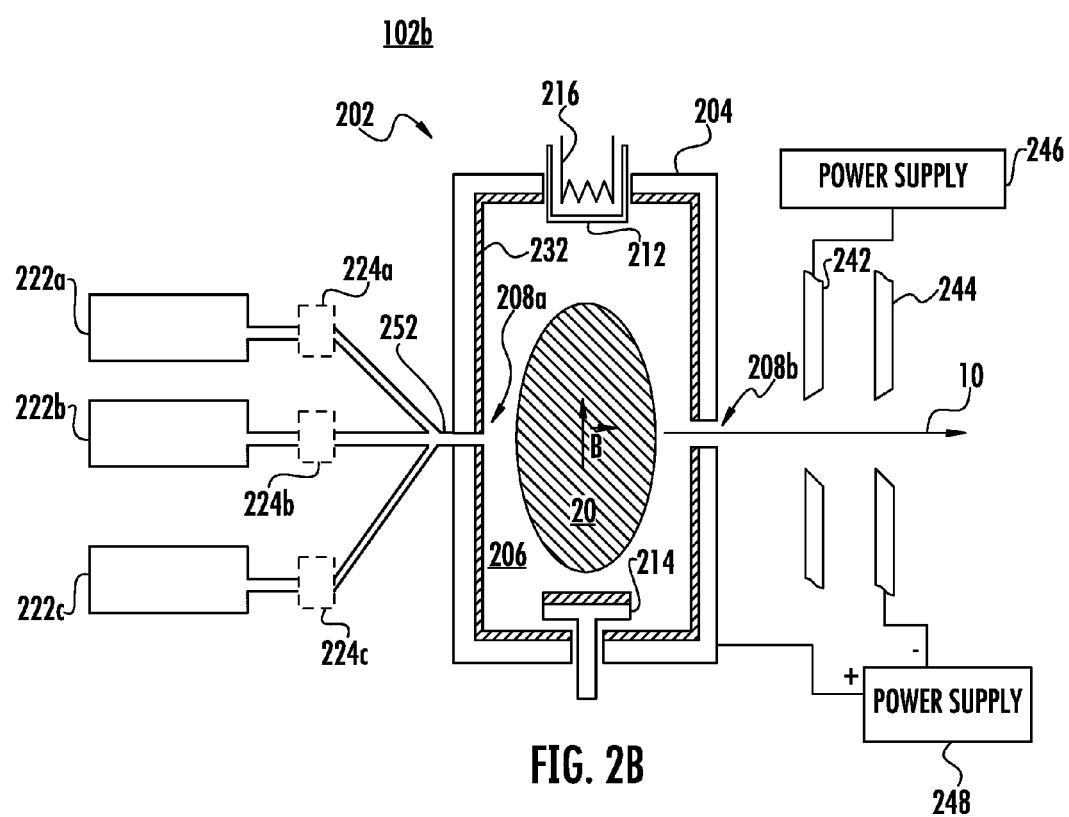
FIG. 2B depicts another exemplary ion source according to another embodiment of the present disclosure.
Figure 2C:
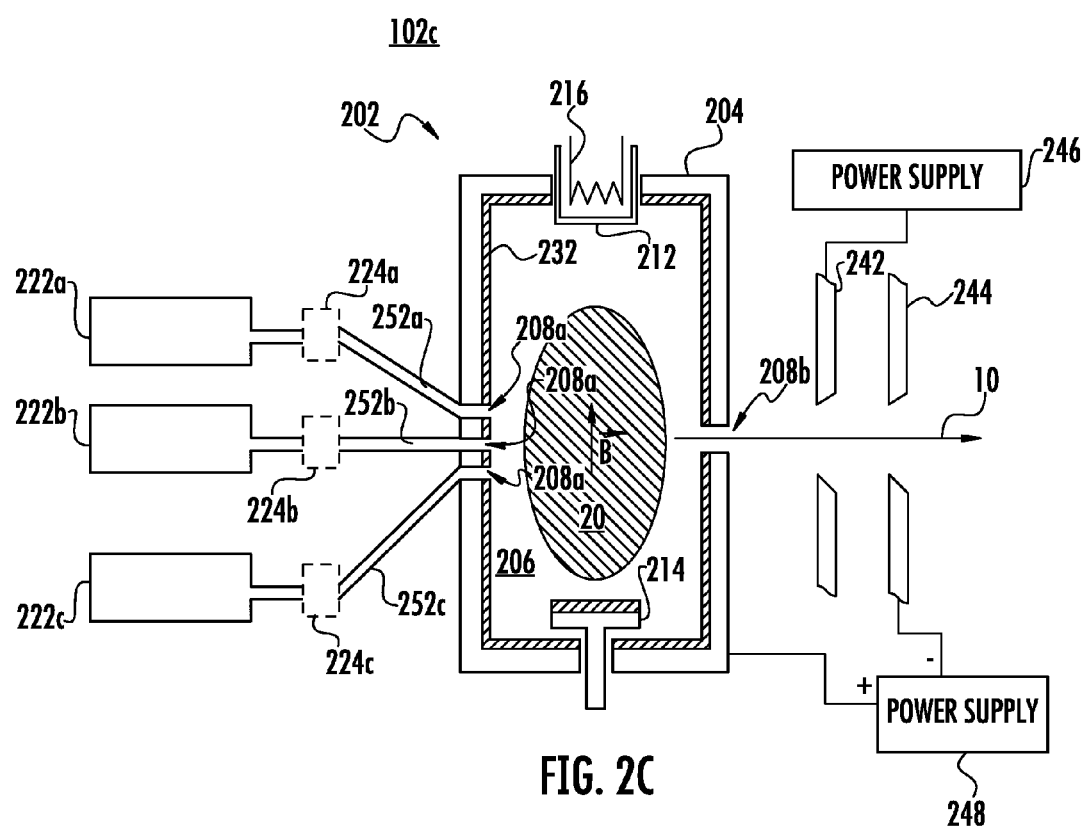
FIG. 2C depicts another exemplary ion source according to another embodiment of the present disclosure.
Figure 2D:
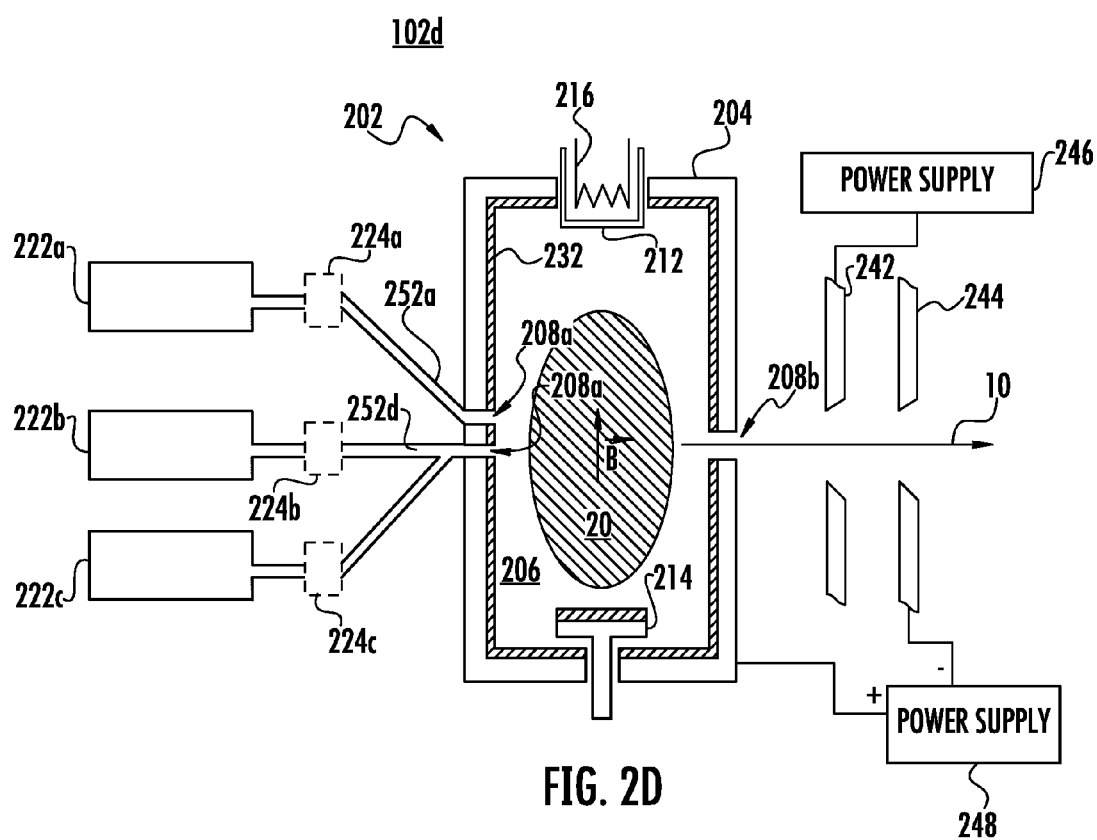
FIG. 2D depicts another exemplary ion according to another embodiment of the present disclosure.

In the ion source 102b-102d shown in FIG. 2B-2D, the film 232 may or may not be provided. If provided, the film 232 may be deposited and fixed onto the arc chamber components, or may be provided as a removable a liner near the arc chamber components. As shown in each of 2B-2D, the film 232, if provided, may be disposed near the repeller 214 and the inner wall of the arc chamber housing wall 204. Although not shown, the present disclosure does not preclude a scenario where the film 302 is also disposed on the cathode 208, another one of the arc chamber components. In the present embodiment, the film 232 may contain C species.

As illustrated in FIG. 2B-2D, a plurality of containers 222a-222c may be provided near the arc chamber housing 202. One of the containers 222a-222c may be the processing material container 222a containing the processing material. The description of the embodiments shown in FIG. 2B-2D may focus on the processing materials containing C and O species, where C is the implant species and O is the implant species carrier. In particular, the description of the processing material will be focused on CO$_2$. However, those of ordinary skill in the art will recognize that other processing materials containing other implant species or implant species carrier (e.g. CH$_4$) are not excluded.

First and second non-implant material containers 222b and 222c may also be provided, each containing different non-implant materials. Those of skill in the art will recognize that in some embodiments, only one non-implant material and only one non-implant container may be provided. In other embodiments, three or more non-implant materials and three or more non-implant containers may be provided. In some other embodiments, unequal number of non-implant materials and non-implant material containers may be provided. In such embodiments, one container may contain more than one non-implant materials. Alternatively, more than one container may contain the same non-implant materials.

In the present embodiment, the first non-implant material container 222b may contain Xe or other materials containing Xe. In some embodiments, the second non-implant material container 222c may contain Kr or Ar (or the material containing thereof) instead of or in addition to Xe. If desired, a second non-implant material container 222c may be provided, and the second non-implant container 222c may contain H$_2$ gas or other material containing H.

In the embodiment shown in FIG. 2B, the first non-implant material container 222b and the associated first non-implant material controller 224b, if included, may provide a predetermined amount of Xe containing material into the arc chamber 206 via a conduit 252. Meanwhile, H containing material (e.g. H$_2$ gas) may also be introduced into the arc chamber 206 from the second non-implant material container 222b via the optionally included non-implant material controller 224c. Meanwhile, the processing material containing CO$_2$ may be transported from the implant material container 222a to the arc chamber 206 via the optionally included processing material controller 224a.

As illustrated in FIG. 2B, CO$_2$, H$_2$, and Xe may be provided into the arc chamber 206 via the same conduit 252. Thus, the materials may be pre-mixed in the conduit 252 before entering the arc chamber 206. In another embodiment, as depicted in FIG. 2C, CO$_2$, H$_2$, and Xe may be provided into the arc chamber 206 of the ion source 102c via different conduits 252a, 252b, and 252c. In such a case, the materials are mixed inside the arc chamber 206. In the embodiment shown in FIG. 2D, one conduit 252a is provided for the CO$_2$, and a separate conduit 252d is provided for H$_2$ and Xe, which are pre-mixed before entering the arc chamber 206. The pre-mixed H$_2$ and Xe may then mix with CO$_2$ inside the arc chamber 206.

When the filament 216 is activated and the electrons are emitted from the cathode 208, those electrons ionize the implant material containing C and/or O species, and one or both of H$_2$ and Xe. The electrons in the arc chamber 206 may follow spiral trajectories of the magnetic field B to increase the number of ionizing collisions. The repeller 210, which is negatively charged, meanwhile, may repel the electrons back to cause additional ionizing collisions.

The plasma 20 generated in the arc chamber 206 may contain, among others, electrons, ions, and other chemical fragments of $CO_2$, $H_2$, and Xe. From this plasma 20 one or more species is extracted from the ion source 202a-202d and directed toward the target 122. If desired, other species may be evacuated from the ion source 102a-102d and discarded.

It has been found that introducing at least one of $H_2$ and Xe into the arc chamber 206 along with the implant material containing C and/or O species can improve the lifetime of the ion sources 102. As noted above, H and/or Xe can reduce the amount of byproduct formed inside the arc chamber 206 as a result of excessive C ions reacting with W surface exposed to the plasma 20. Adding H and Xe species can also reduce formation of tungsten oxide on the surfaces of the arc chamber components exposed to the plasma. For example, H ions may react with O ions to form $H_2O$ vapor that can readily be evacuated from the ion sources 102b-102d. Meanwhile, Xe ions can also sputter any tungsten oxide byproduct formed on the ion source components.

In addition, it has been found that Xe ions may enhance formation and operation of the $CO_2$ plasma. It has been found that adding Xe containing material in the ionization of $CO_2$ does not reduce the arc current. As those skilled in the art might appreciate, adding material other than the processing material (e.g. dilutant) into the arc chamber 206 generally reduces the ion current or the concentration of ions extracted from the arc chamber 206. However, it has been found that adding Xe containing material and (with or without H containing material) leads to increase in C ion current. Without wishing to be bound to a particular theory, it is believed that Xe ions enable $CO_2$ plasma to operate at lower arc voltage such that same amount of C ion current may be achieved at lower bias power applied to the filament 216. Alternatively, greater amount of C ion current may be achieved at the same bias power. As such, Xe ions may enable the plasma to operate more efficiently. Such an increase in the efficiency appears particularly effective in generating and maintaining plasma containing at least one noble species and at least one of Group 15 or Group 16 species. Accordingly, it has been found that adding Xe species in the ionization of the processing material containing at least one species found in Group 15 or 16 species (e.g. CO, $CO_2$), whether such species is desired implant species or implant species carrier. As such, the performance and the lifetime of an ion source can be greatly improved by ionizing $CO_2$ dopant carrier and adding non-implant material containing Xe and/or H.

Although the present disclosure does not preclude introducing other species such as Ar, Kr or other species with high atomic mass in place of Xe, it is believed that greatest improvements may be seen with adding Xe containing material. As such, Xe is preferred even if such other species may be used in some embodiments. In some other embodiments, halogen species such as F, Cl, Br, or I, other species containing such halogen may be introduced instead of H.

The beam current may be additionally increased by providing the film 232 containing desired implant species. In one particular experiment, $CO_2$ processing material is introduced into the arc chamber 206. In this experiment, the graphite liner was disposed on the repeller 214 and the inner wall of the arc chamber housing wall 204. Xenon containing material and H containing material were also introduced into the arc chamber 206. The materials were ionized forming a plasma containing, among others, C, O, Xe, and H ions. In this experiment, C beam current of about 10 mA was achieved. Compared to about 7 mA of C beam current achieved using a conventional ion source without the graphite liner, providing the film with C species increased C beam current to in excess of about 40%. As such, increase in the beam current from about 15% to about 45% may be achieved.

Figure 2E:
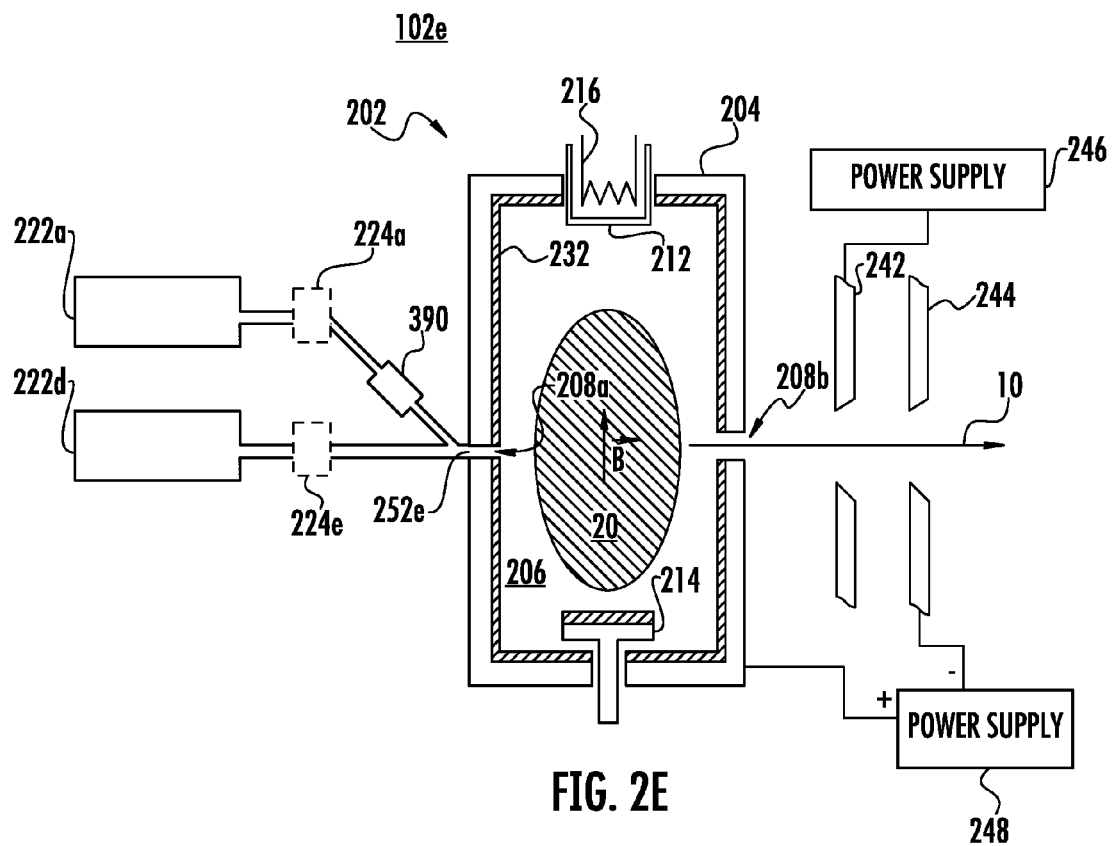
FIG. 2E depicts another exemplary ion according to another embodiment of the present disclosure.

Referring to FIG. 2E, there is shown another exemplary ion source 102e according to another embodiment of the present disclosure. Those of ordinary skill in the art will recognize many of the components included in the ion source 102e shown in FIG. 2E are also included in the ion sources 102a-102d shown in FIG. 2A-2D. As such, the components in FIG. 2e should be understood in relation to the components in FIG. 2A-2D.

Unlike the ion sources 102b-102d shown in FIG. 2B-2D, where one or more non-implant materials are released from separate containers, the ion source 102e shown in FIG. 2E has one container 222d with a mixture of the non-implant materials. For example, the non-implant material container 222d may already include a mixture of Xe and H containing materials. An optionally included associated material controller 224e may control the amount of the non-implant materials introduced into the arc chamber 206. In one embodiment, the ratio of Xe containing material to H containing material may be approximately 60% Xe containing material and 40% H containing material. In another embodiment, the ratio of Xe containing material to H containing material may be approximately 40% Xe containing material and 60% H containing material. Other various ratios may also be considered. In addition, the ion source 102e of the present embodiment, unlike the ion source 102a shown in FIG. 2A, may also include the processing material container 222a to provide the processing material into the arc chamber 206. The processing material from the processing material container 222a and the pre-mixed non-implant materials from the non-implant material container 222d are also mixed in the conduit 252e prior to entering the arc chamber 206.

It should be appreciated that while only two non-implant species containing materials are described with reference to FIG. 2A-2E, those of ordinary skill in the art would recognize that a greater number of non-implant species containing materials, containers, and the material controllers may be implemented.

It should be appreciated that while embodiments of the present disclosure are directed to introducing one or more non-implant materials for improving performance and lifetime of ion sources in an ion implantation system, other implementations may be provided as well. For example, a technique for introducing one or more dilutants may apply to plasma-based ion implantation systems, such as glow discharge ion source (GD-PLAD) or radio frequency plasma doping (RF-PLAD) systems using DC or AC current. Other various implementations may also be provided.

In addition to improving performance and lifetime of ion sources in ion implanter systems, the presently disclosed technique for using one or more dilutants in an ion source may have further advantages. For example, greater efficiency in the use of an ion source may be achieved because excessive time and costs due to ineffective, inefficient, and redundant steps associated with traditional ion implantation techniques may be reduced and/or eliminated using the improved dilutant technique of the present disclosure.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method for ion implanting a target, the method comprising:
providing a predetermined amount of processing gas in an arc chamber of an ion source, the processing gas containing implant species and implant species carrier, the implant species being C and the implant species carrier being one of O and H;
providing a predetermined amount of dilutant into the arc chamber, wherein the dilutant comprises a noble species containing material;
providing a film on an inner wall of the arc chamber, the film containing the implant species; and
ionizing the processing gas and the dilutant.

2. The method according to claim 1, wherein the noble species comprises one of Ar, Kr, and Xe.

3. The method according to claim 1, wherein the processing gas comprises one of CO and $CO_2$.

4. The method according to claim 3, wherein the dilutant further comprises H containing material.

5. The method according to claim 4, wherein the dilutant comprises a mixture of Ar and $H_2$.

6. The method according to claim 4, wherein the dilutant is a mixture of Kr and $H_2$.

7. The method according to claim 4, wherein the dilutant is a mixture of Xe and $H_2$.

8. The method according to claim 1, wherein the processing gas is $CH_4$.

9. The method according to claim 1, further comprising: providing the film on a repeller of the ion source.

10. The method according to claim 1, further comprising: extracting the ions of the implant species from the ion source and directing the ions of the implant species toward the target.

11. A method for ion implanting a target, the method comprising:
providing a predetermined amount of processing gas in an arc chamber of the ion source, the processing gas containing implant species and implant species carrier, the implant species carrier being one of O and H, where the implant species reacts with walls of the arc chamber to form a byproduct;
providing a predetermined amount of dilutant into the arc chamber, the dilutant comprising a noble species containing material, wherein the noble species comprises one of Ar, Kr, and Xe;
ionizing the processing gas and the dilutant to generate ions of the implant species, wherein ions of the noble species cause the byproduct to be removed from the walls;
extracting the ions of the implant species from the ion source; and
directing the ions of the implant species toward the target;
where the implant species is selected from the species found in Group 13 to Group 16 of the periodic table.

12. The method according to claim 11, wherein the dilutant further comprises $H_2$, wherein ions of hydrogen inhibit the formation of the byproduct on the walls.

13. The method according to claim 12, wherein the dilutant is a mixture of Ar and $H_2$.

14. The method according to claim 12, wherein the dilutant is a mixture of Kr and $H_2$.

15. The method according to claim 12, wherein the dilutant is a mixture of Xe and $H_2$.

16. The method of claim 11, wherein the implant species is C.

17. The method according to claim 16, wherein the processing gas comprises one of CO, and $CO_2$.

18. The method according to claim 16, wherein the processing gas comprises $CH_4$.

19. A method for ion implanting a target, the method comprising:
ionizing a predetermined amount of processing gas and dilutant in an arc chamber of an ion source to generate ions of implant species,
wherein the processing gas is C and O containing material,
wherein C is the implant species, the dilutant comprising H containing material and a material containing a noble gas, being one of Ar, Kr, and Xe,
wherein the implant species react with walls of the arc chamber to form a byproduct, ions of H react with the implant species to inhibit the formation of the byproduct, and ions of the noble gas cause the byproduct to be removed from the walls of the arc chamber; and
extracting ions of C from the arc ion source and directing the ions of the implant species toward the target.

* * * * *